United States Patent
Heid et al.

(10) Patent No.: US 7,259,561 B2
(45) Date of Patent: Aug. 21, 2007

(54) GENERATOR OF A TIME-VARIABLE MAGNETIC FIELD AND MAGNETIC RESONANCE DEVICE

(75) Inventors: Oliver Heid, Gunzenhausen (DE); Markus Vester, Nürnberg (DE)

(73) Assignee: Siemens Aktiengesellschaft, Munich (DE)

( * ) Notice: Subject to any disclaimer, the term of this patent is extended or adjusted under 35 U.S.C. 154(b) by 158 days.

(21) Appl. No.: 11/039,594

(22) Filed: Jan. 20, 2005

(65) Prior Publication Data
US 2005/0162167 A1 Jul. 28, 2005

(30) Foreign Application Priority Data
Jan. 23, 2004 (DE) .................. 10 2004 003 535

(51) Int. Cl.
*G01V 3/00* (2006.01)
(52) U.S. Cl. .................................. 324/318
(58) Field of Classification Search ............. 324/307, 324/309, 318
See application file for complete search history.

(56) References Cited

U.S. PATENT DOCUMENTS

| | | | | |
|---|---|---|---|---|
| 4,766,378 A | * | 8/1988 | Danby et al. | 324/307 |
| 5,194,810 A | * | 3/1993 | Breneman et al. | 324/319 |
| 5,357,958 A | * | 10/1994 | Kaufman | 600/410 |
| 5,359,310 A | * | 10/1994 | Pissanetzky | 335/301 |
| 5,386,191 A | * | 1/1995 | McCarten et al. | 324/318 |
| 5,519,372 A | * | 5/1996 | Palkovich et al. | 335/216 |
| 5,663,645 A | * | 9/1997 | Kaufman et al. | 324/318 |
| 5,675,305 A | * | 10/1997 | DeMeester et al. | 335/302 |
| 5,923,169 A | * | 7/1999 | Ehnholm et al. | 324/319 |
| 6,023,165 A | * | 2/2000 | Damadian et al. | 324/318 |
| 6,097,187 A | * | 8/2000 | Srivastava et al. | 324/320 |
| 6,163,240 A | * | 12/2000 | Zuk et al. | 335/299 |
| 6,208,144 B1 | * | 3/2001 | McGinley et al. | 324/319 |
| 6,218,838 B1 | * | 4/2001 | McGinley et al. | 324/320 |
| 6,335,670 B1 | * | 1/2002 | Kinanen | 335/296 |
| 6,433,550 B1 | | 8/2002 | Kinanen | |
| 6,441,615 B1 | * | 8/2002 | Fujita et al. | 324/318 |
| 6,522,143 B1 | * | 2/2003 | Fujita et al. | 324/318 |
| 6,677,753 B1 | * | 1/2004 | Danby et al. | 324/318 |

(Continued)

FOREIGN PATENT DOCUMENTS

DE 40 37 894 A1 6/1991

(Continued)

*Primary Examiner*—Brij Shrivastav
*Assistant Examiner*—Dixomara Vargas

(57) ABSTRACT

A generator (13A, . . . 13C) of a time-variable magnetic field (B1) of a magnetic resonance device (1) which has an examination space (9,9A) for accommodating at least one area to be examined of an examination subject (7), in which examination area the time-variable magnetic field (B1) is generated by means of a current through a conductor (15, 19, 31). The magnetic field lines (23) of the magnetic field (B1) close with the aid of a field flux return space (17), in which there is arranged at least one sub-assembly (27) which has magnetizable material. A reduction of a magnetic energy density in the field flux return space (17) is produced by this means. This increases e.g. the efficiency in the generation of high-frequency magnetic fields (B1) or of gradient fields with the aid of the conductor (15,19,31).

22 Claims, 2 Drawing Sheets

U.S. PATENT DOCUMENTS

| | | | |
|---|---|---|---|
| 6,781,492 B2 * | 8/2004 | Takeshima et al. | 335/216 |
| 6,909,347 B2 * | 6/2005 | Wakuda et al. | 335/296 |
| 6,930,482 B2 * | 8/2005 | Heid et al. | 324/318 |
| 7,026,816 B2 * | 4/2006 | Gebhardt et al. | 324/318 |
| 7,109,715 B2 * | 9/2006 | Heid et al. | 324/322 |

FOREIGN PATENT DOCUMENTS

| | | |
|---|---|---|
| DE | 42 32 884 A1 | 3/1994 |
| DE | 44 22 781 C1 | 2/1996 |
| DE | 101 24 737 A1 | 12/2002 |

* cited by examiner

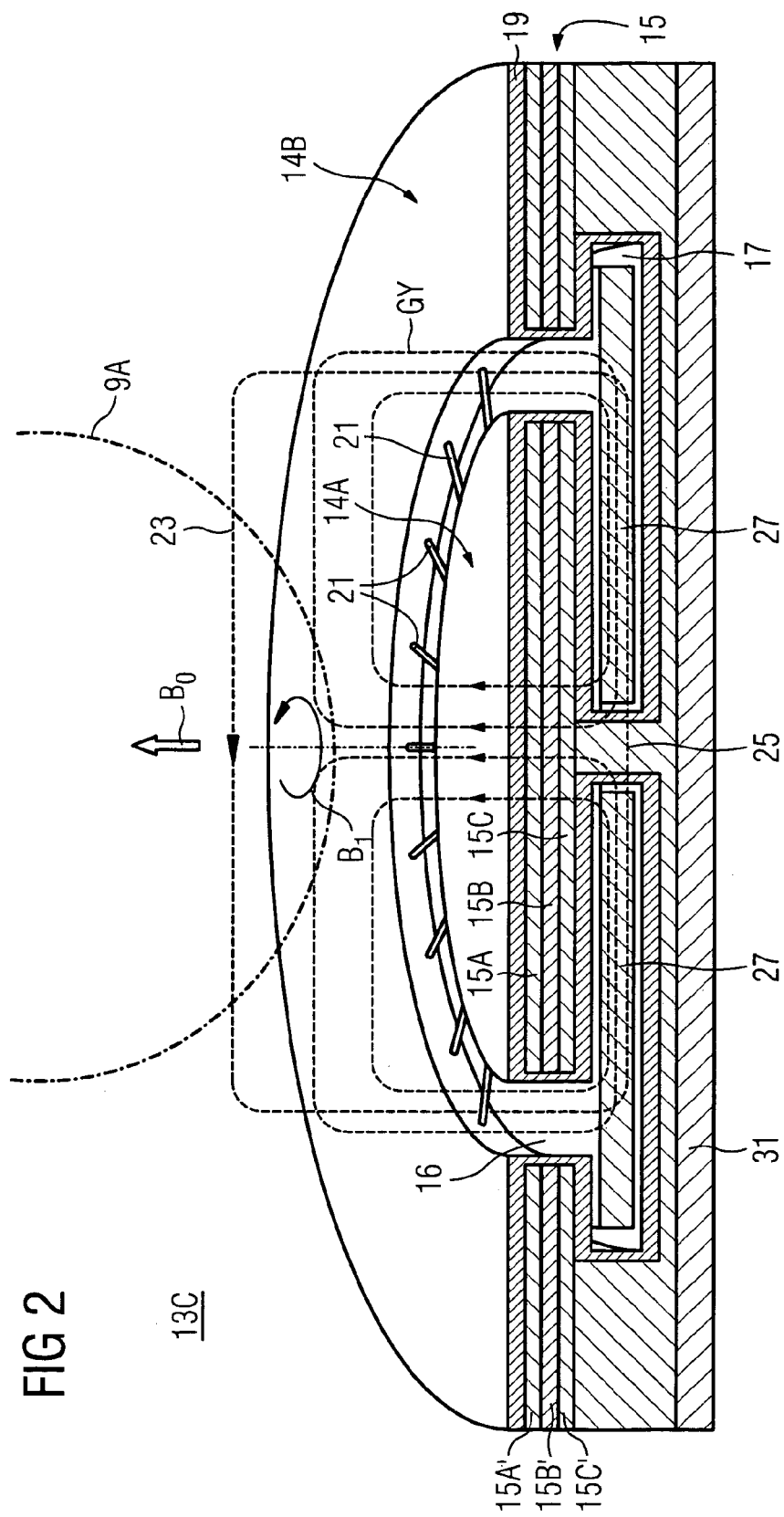

GENERATOR OF A TIME-VARIABLE MAGNETIC FIELD AND MAGNETIC RESONANCE DEVICE

CROSS REFERENCE TO RELATED APPLICATIONS

This application claims priority to the German application No. 10 2004 003 535.0, filed Jan. 23, 2004 which is incorporated by reference herein in its entirety.

FIELD OF INVENTION

The invention relates to a generator of a time-variable magnetic field of a magnetic resonance device which has an examination space for accommodating at least one area of an examination subject, in which space the time-variable magnetic field is generated. The invention also relates to a magnetic resonance device having a generator of this type.

BACKGROUND OF INVENTION

Magnetic resonance technology is a known technology for, among other things, obtaining images of the inside of a body of an examination subject. In a magnetic resonance device (MR device), rapidly switched magnetic gradient fields which are generated by means of gradient coils are superimposed on a static main magnetic field $B0$ which is generated by a main field magnet. In order to emit magnetic resonance signals, the magnetic resonance device comprises further a high-frequency antenna (HF antenna) which irradiates the examination subject with HF signals, the so-called $B1$ field. With the aid of this antenna or further local antennas, the emitted magnetic resonance signals can be recorded and processed into magnetic resonance images. The $B1$ field and the HF field are generally generated by currents through a conductor.

From U.S. Pat. No. 6,433,550, for example, an open magnetic resonance device having a C-shaped main field magnet is known which comprises at each of the two ends of the C structure on either side of a space for accommodating a patient, said space being arranged in the opening of the C structure of the magnetic resonance device, pole pieces between which the main magnetic field of the magnetic resonance device can be generated at least inside the space for accommodating a patient. Furthermore, there are arranged on each of the pole pieces, on the sides facing the space for accommodating a patient, parts, fashioned essentially planarly, of a gradient coil system and, adjacent thereto, parts, also essentially planarly fashioned, of an antenna system of the magnetic resonance de vice. Gradient coils for the above-mentioned gradient coil system are described in detail for example in DE 40 37 894 A1 and DE 44 22 781 C1.

Furthermore, from DE 42 32 884 A1 an antenna arrangement for a nuclear-magnetic resonance device is known in which a main magnetic field is established between two pole pieces. A sub-antenna into which a high-frequency current is fed is arranged on each pole piece. The sub-antennas consist of a closed, grounded shield facing the respective pole piece and a planar conductor structure arranged at a distance from, and essentially parallel to, the shield.

Furthermore, it is known from DE 42 32 884 A1 that the objective in the case of pole—piece main field magnets is to keep the distance between the pole pieces as small as possible so that the weight of the main field magnet remains small and better homogeneity of the main magnetic field is achieved. For this reason, it is advantageous to keep all components accommodated between the pole pieces such as the gradient coil system, the high-frequency shield and the antenna arrangement, as flat as possible. On the other hand, for the described antenna arrangement to have a high level of efficiency, the maximum possible gap between the antenna arrangement and the high-frequency shield is advantageous. This applies in particular where the antenna arrangement is used for receiving magnetic resonance signals.

A circular planar high-frequency antenna for open magnetic resonance devices is known from DE 101 24 737 A1. It has two spaced systems of planar conductors, arranged on a mounting plate, for currents crossing one another. The conductors are capacitatively shortened at at least one end to tune to the desired resonance frequency by means of tuning capacitors connected to ground. There is arranged on each mounting plate only one planar metal layer into which, shifted through 90°, the two currents, which are in turn by 90° out of phase, are fed. Tuning capacitors are arranged at the infeed point and on the opposite side.

SUMMARY OF INVENTION

Since in general in magnetic resonance equipment space inside the homogeneous main magnetic field $B0$ is costly and therefore scarce, any attempt to fill the available space minimally with installed components or to make maximum use of the available space for patients is advantageous.

An object of the invention is to specify a generator and a magnetic resonance device having a generator of this type which have as compact a design as possible, i.e. in particular a low structural height coupled with a high degree of efficiency.

This object is achieved by the claims.

An advantage of the invention lies in the fact that the sub-assembly influences with the magnetizable material the magnetic field (H field) which is present in the field flux return space, the magnetic induction (B field) remaining the same. This enables efficient generation of a magnetic field (B field) in the examination space since, with the current from the generator being the same, a reduced H field and thus a lower magnetic energy density, proportional to H×B, is present in the field flux return space. Here, the H field is essentially inversely proportional to the effective permeability of the magnetizable material, effective permeability being understood to be the permeability which can be assigned to the entire field flux return space. Consequently, the same magnetic field can be generated in gradient conductors with less current, for example. Furthermore, a field flux return space can be realized that is smaller than it would be without a sub-assembly of this type, while the magnetic field strength in the examination space remains the same. This leads to smaller, more compact and thus more cost-effective structures.

A further advantage is based upon the fact that because of the magnetization a diminished 'active' magnetic field is present, i.e. reduced magnetic interaction takes place with electrical components which are arranged in the proximity of the field flux return space.

Because of the reduced H field, lower ohmic losses occur in adjacent electrical components, for example in electrical conductors, because of the time-variable magnetic field. Accordingly, the time-variable magnetic field can be generated more efficiently since less current has to flow in the gradient coil. For this reason also, a field flux return space can be realized that is smaller than it would be without a sub-assembly of this type, while the magnetic field strength in the examination space remains the same. This leads, as stated, to smaller, more compact and thus more cost-effective structures.

A great variety of types of time-variable magnetic fields is generated in a magnetic resonance device: For example, high-frequency fields are irradiated into the examination space with the aid of a high-frequency antenna unit having an antenna conductor for stimulating tissue located there to emit magnetic resonance signals. Furthermore, so-called gradient fields which produce a location-dependence of the emitted magnetic resonance signal are needed e.g. for location coding of the examination space. A primary gradient field of this type is generated with the aid of a primary gradient coil having a gradient conductor through which very strong currents flow. Often, to offset the primary gradient field outside the examination space, a secondary gradient-coil unit having a secondary gradient conductor is used, the secondary gradient-coil unit usually being further away from the examination space than the primary gradient-coil unit. The conductors mentioned are generally fashioned differently in accordance with their function and arranged in the magnetic resonance device.

One or more of these conductors can generate magnetic fields individually or jointly, generation with the aid of the sub-assembly being more efficient than without, so that, as stated, less current, for example, is needed and/or more space is available because of a smaller and more compact design. The magnetic fields in the field flux return space cause losses, for example through induced currents in the adjacent conductive HF shield. These are, since the magnetic energy density of the magnetic field in the field flux return space is generally greater than in the examination space, correspondingly large and their reduction with the aid of the sub-assembly has a direct impact on the efficiency of field generation.

In accordance with the invention, a sub-assembly which has magnetizable material is arranged in the field flux return space. Overall, this causes a reduction in magnetic energy density in the field flux return space and consequently for example reduced gradient currents and leads moreover to less disadvantageous effects of the magnetic field in the field flux return space on the adjacent electrical components.

The magnetic resonance device is based for example on a C-shaped permanent magnet with e.g. a vertical main magnetic field. The main magnetic field lies between two opposing pole pieces and is as homogeneous as possible in the examination space of the magnetic resonance device. If on each pole piece a generator according to the invention is arranged with a magnetized sub-assembly, the effectively active distance between the pole pieces is reduced by the thickness of the sub-assemblies of the generators. This effective shortening is based upon the full, or preferably up to several 100 mT not yet fully saturated, magnetization of the magnetizable material by the main magnetic field, i.e. the distance between the pole pieces which determines the forming of the main magnetic field is shortened by the sub-assembly with magnetizable material. This produces a more efficient generation of the main magnetic field and also has a positive effect on the homogeneity and possibly on the strength of the main magnetic field. This is based upon the fact that to close the path of the main magnetic field the air gap is reduced by the thickness of the magnetizable material, which thickness is essentially determined by the thickness of the sub-assembly. The magnetic resonance device according to the invention is more cost-effective to manufacture since, for a given quality and strength of the main magnetic field, lower requirements are placed upon the magnet.

In an advantageous embodiment of the generator, the field flux return space is essentially delimited by a high-frequency shield (HF shield). This prevents any penetration of the high-frequency field into the main field magnet or into the gradient-coil units of the magnetic resonance device. However, because of the time-variable magnetic fields, currents are also induced in the HF shield, which currents lead to ohmic losses and consequently impair the efficiency of HF emission or of gradient-field generation. The currents in the HF shield are reduced according to the invention with the aid of the sub-assembly having magnetizable material.

In a particularly advantageous embodiment of the generator, the sub-assembly comprises a plurality of segments which can be combined in particular to form a flat disk. This has the advantage that in the manufacture of the generator the sub-assembly can easily be inserted, dismantled in segments, into the field flux return space. Ferrimagnetic and ferromagnetic materials are available as magnetizable material, for example iron powder or ferrite. For electrical insulation purposes, the magnetizable material is preferably surrounded by an insulating substrate.

In a particularly advantageous embodiment of the generator, two biplanar gradient coils lie parallel to one another. They are sheathed by a high-frequency shield which, in the area of the primary gradient coil, act as an antenna conductor of the high-frequency antenna. The field flux return space for the gradient fields and HF fields is arranged between the biplanar gradient-coil units. A primary gradient coil shielded in this way is not particularly efficient without a sub-assembly with magnetizable material as, due to the small gap between the two gradient-coil units, a high magnetic energy density is present in the field flux return space. According to the invention, however, the high magnetic energy density ½ B×H is reduced with the aid of the magnetizable material in the sub-assembly. In this embodiment, the HF field flux return is simultaneously improved since the efficiency is proportional to the effective permeability $\mu$.

The sub-assembly is fashioned, for example, in the form of a disk and is magnetized by the HF fields and gradient fields in its longitudinal dimension and perpendicularly thereto by the main magnetic field B0. Even at full saturation, the effective permeability $\mu$ is substantially greater than 1 due to the continuing possibility of rotation of the magnetization. The magnetic field energy stored in the field flux return space is thus, for a given thickness, less by a factor of $\mu$ than in the case of a field flux return space filled with air or the thickness of the field flux return space, i.e. the distance between the biplanar gradient-coil units, can be reduced by approximately this factor—taking into account the unaffected portion of the magnetic field energy in the patient examination space—while the gradient field strength in the examination space remains the same.

A generator according to the invention displays lower ohmic losses. It can improve high-frequency efficiency and gradient-coil efficiency and lead to more effective generation of the main magnetic field.

BRIEF DESCRIPTION OF THE DRAWINGS

Further advantageous embodiments of the invention are characterized by the features of the dependent claims.

A description of a plurality of embodiments of the invention follows, with reference to FIGS. 1 and 2, in which.

DETAILED DESCRIPTION OF INVENTION

Figure 1:
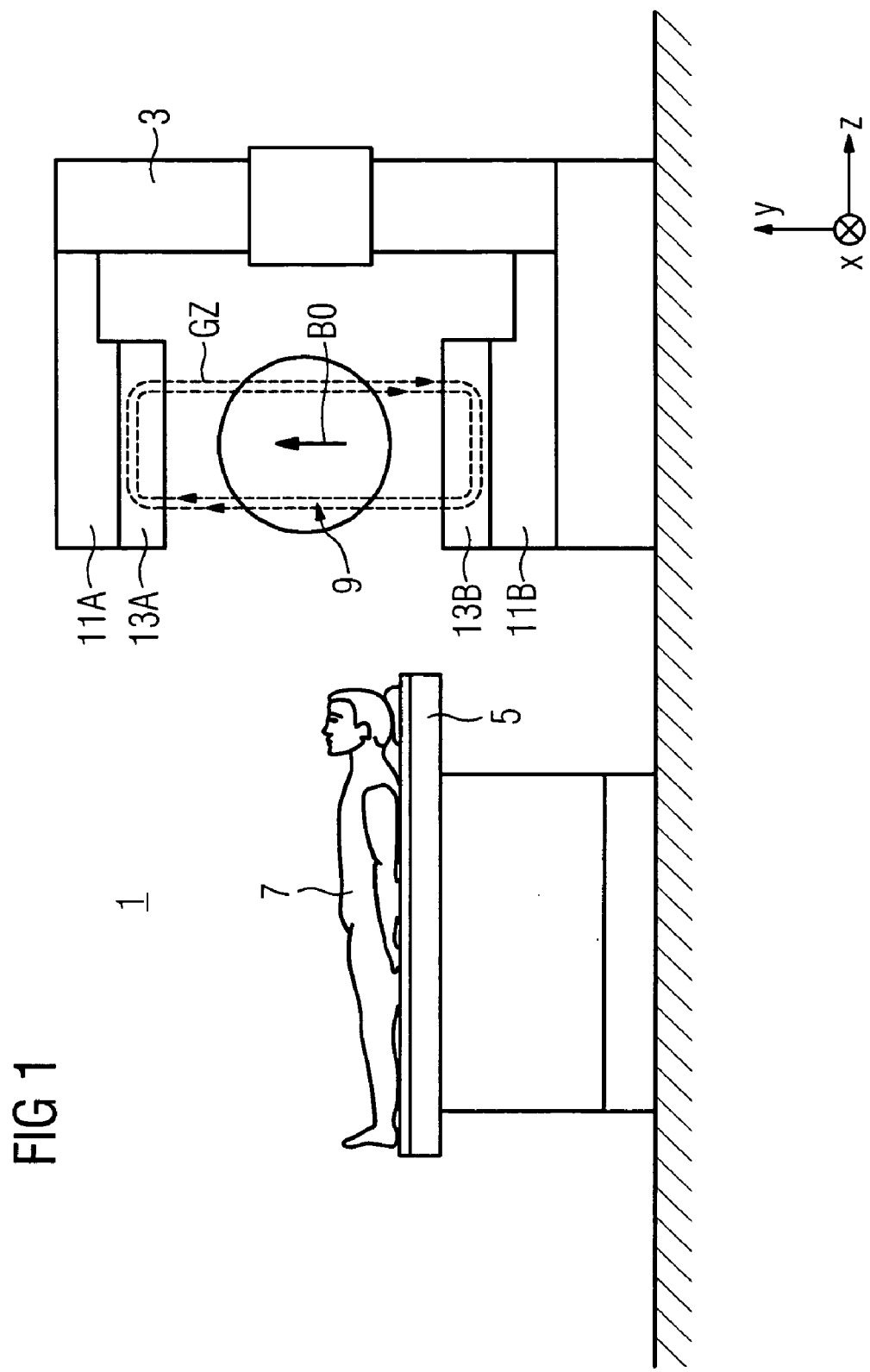
FIG. 1 shows schematically a magnetic resonance device having a C-shaped main field magnet and two gradient-coil HF antenna units, FIG. 2 one half of a gradient-coil high-frequency antenna unit according to the invention comprising a primary and a secondary gradient-coil unit.

FIG. 1 shows schematically an open magnetic resonance device 1 for medically examining patients e.g. by means of MR tomography or MR spectroscopy in a main magnetic field B0 which is generated with a C-shaped main field magnet 3. The B0 field, which is constant over time, is generated according to the specified system of coordinates along the Y axis and lies e.g. in the order of 0.3 T. Also shown schematically is a patient bed 5 with which a patient 7 can be entered into the examination space 9. The examination space 9 is arranged in the air gap between two pole elements 11A,11B of the main field magnet 3.

The pole elements 11A,11B have e.g. solenoid actuators. Gradient-coil HF antenna units 13A,13B adapted to the pole elements 11A,11B generate in the examination space 9 on the one hand gradient fields GZ and on the other B1 high-frequency fields which are oriented perpendicularly to the main magnetic field B0. As an example, magnetic-field lines of a gradient field GZ are indicated along the Z axis in FIG. 1. Due to the cylindrical symmetry, a similar field is generated along the X axis. A corresponding gradient-field pattern along the Z axis is indicated in FIG. 2. The gradient-coil HF antenna units 13A,13B enable e.g. a high-sensitivity MR image recording and match the generators of a time-variable magnetic field according to the invention in a plurality of ways, since they have a wide variety of conductors for generating time-variable magnetic fields, e.g. antenna conductors for generating the HF field and gradient conductors for generating gradient magnetic fields in one or in multiple directions.

The pole elements 11A,11B and consequently also the gradient-coil HF antenna units 13A,13B have, for example, a diameter in the order of 50 cm, 80 cm, 100 cm or greater than 100 cm. The air gap is shortened due to the magnetizable material in the inventive sub-assembly of the gradient-coil HF antenna units 13A,13B.

FIG. 2 shows as an embodiment of the invention an approximately coaxial longitudinal section through a perspectively represented half of a gradient-coil HF antenna unit 13C which can be used particularly advantageously with an open MR device, as outlined in FIG. 1. For example, the gradient-coil HF antenna unit 13C shown can be used on the lower pole element 11B of the C-shaped main field magnet 3 of the magnetic resonance device 1 shown in FIG. 1 and a further identical gradient-coil HF antenna unit, rotated by 180°, can be used on the upper pole element 11A.

The gradient-coil HF antenna unit 13C shown comprises a disk-shaped area 14A and a ring-shaped area 14B in which electrical conductors of the primary gradient-coil unit 15 with gradient coils 15A, . . . 15C' are arranged for the three spatial axes. The thickness of the primary gradient-coil unit 15 lies in the order of 2 cm. A ring-shaped free space 16 extends between the disk-shaped area 14A and the ring-shaped area 14B. This free space functions as an opening and access to a ring-shaped field flux return space 17 lying anteriorly thereto and forming an undercut in relation to the ring-shaped free space 16.

Furthermore, the areas 14A and 14B are to a large extent sheathed by a high-frequency shield 19 and the field flux return space 17 lined by the high-frequency shield 19. The high-frequency shield 19 can, in a known manner, comprise for example a plurality of layers of an electrically conductive foil and be fashioned with capacitatively bridged slots. The thickness of the conductors functioning as a high-frequency shield 19 lies e.g. in the order of 15 μm.

Areas of the high-frequency shield 19 are part of a high-frequency antenna with which a high-frequency field $B_1$ rotating e.g. about the direction of the main magnetic field $B_0$ can be generated and with which magnetic resonance signals can be received. Thus the part of the HF shield 19 lining the field flux return space 17 essentially forms the resonator of the HF antenna. The ring-shaped free space 16 is also bridged with resonator elements 21 arranged in the form of spokes, which comprise e.g. longitudinal capacitors and enable tuning of a resonance frequency and feeding in and reading out of HF signals.

If, for example, a high-frequency signal from a high-frequency source is fed in, then in the resonator of the HF antenna a voltage gradient forms for example on the part of the HF shield 19 surrounding the primary coil unit, which voltage gradient falls from +U in the infeed capacitor to −U in the opposite capacitor. The voltage gradient on the part of the HF shield 19 opposite in relation to the field flux return space 17 is correspondingly from +U in the opposite capacitor to −U in the (infeed) capacitor. This voltage gradient produces a current along the HF shield 19 which, due to the geometric relationship flows in mutually opposing directions so that the currents attract one another and the current in the part of the HF shield 19 enclosing the primary gradient-coil unit essentially flows on the side of the field flux return space 17. The distance between the currents of approx. 2-3 cm results in a sufficiently large high-frequency magnetic field B1 in the examination space 9A, the magnetic field lines closing through the field flux return space 17.

A field line 23 of the high-frequency field B1 is shown in FIG. 2 for a sample point in time, said field line, starting from the examination space, closing through the ring-shaped free space 16 and the field flux return space 17. The field flux return space 17 is used here in a plurality of ways, since both the field lines of the high-frequency field B1 and field lines of the gradient fields generated by the gradient coils 15,31 close in it. The mode of operation of a disk-shaped circular planar high-frequency antenna system is described in detail in document DE 101 24 737 A1 which was mentioned in the introduction.

The primary gradient-coil unit 15 can have any form. The design of the primary gradient-coil unit 15 as a circular disk, as shown in FIG. 2, has the advantage that this design can be ideally adapted to the area of the most homogeneous B0 field pattern. The generator 13C also comprises a disk-shaped area in which are arranged conductors of the shield coils belonging to the gradient coils (secondary gradient-coil unit 31).

If a current passes through a gradient coil of the primary gradient-coil unit 15, then a gradient magnetic field which is superimposed on the main magnetic field B0 inside the examination space 9A forms in the respective spatial direction. The gradient field GY which generates a field gradient along the Y axis has been indicated schematically as an example in FIG. 2. If a current is simultaneously passed through the corresponding gradient coil of the secondary gradient-coil unit 31, then this substantially offsets the gradient field of the primary gradient-coil unit 15 outside the examination area 9A. The magnetic field lines of the gradient fields of the gradient-coil units 15, 31 likewise close through the field flux return space 17.

However, due to the geometry of the arrangement and in normal gradient magnetic fields of several mT or high-frequency fields in the order of several tens of µT, there is a magnetic energy density in the field flux return space 17 which leads to interactions with the high-frequency shield 19 e.g. with ohmic losses. According to the invention, a sub-assembly 27 which contains magnetizable material is therefore arranged in the field flux return space 17 in order to reduce the magnetic energy density of the HF field and/or of the primary and/or of the secondary gradient field.

Due to their low losses, the use of non-conductive materials such as ferrite (e.g. the SIFERRIT material K1, see "Ferrite—Weichmagnetische SIFERRIT Materialien" [Ferrites—soft magnetic SIFERRIT materials], data book 1986/1987) or iron powder in an insulating substrate (e.g. plastic) is particularly advantageous as magnetizable material. SIFERRIT K1 has for example a relative permeability of $\mu_r=80$ and a saturation field strength of 300 mT for frequencies up to approx. 12 MHz.

Magnetically soft materials with a narrow hysteresis are preferably used in the sub-assembly. Here the opposing field and residual magnetization are as small as possible so that, upon reversal of polarity of the magnetic field in the magnetizable material, as little energy dissipation as possible has to be expended.

The magnetic energy density is proportional to the product of B field and H field. Accordingly, the magnetic energy density in a vacuum is greater than the magnetic energy density in the magnetizable material by a factor of $\mu$, where $\mu$ is the relative permeability. For a given volume, the field energy in the material is less by a factor of $\mu^{-1}$, since B is constant and the H field is proportional to B/$\mu$, so that considerably less energy is needed to reverse polarity. For powdered iron material, the relative permeability $\mu$ is in the range from 3 to 100 and e.g. for ferrites which are suitable for [...] in the range of 10 MHz, such as occur e.g. in a main magnetic field B0 of approx. 0.3 T, it lies e.g. in the order of 100.

With the aid of the sub-assembly 27, the magnetic field in the field flux return space interacting with the HF shield 19 is reduced according to the permeability $\mu$ of the magnetizable material and the efficiency of the HF antenna and of the gradient coils increased. In this way, high-frequency generation, for example, can be increased by a factor in the order of 3 by comparison with a field flux return space filled with air. This can be used to generate stronger magnetic resonance signals and/or for a more compact, in particular slimmer, design.

Furthermore, the sub-assembly can be used for stabilizing the gradient-coil HF antenna unit 13C. Depending on the embodiment, the sub-assembly can be adapted in terms of its dimensions to the field flux return space. For example, it can be subdivided into a plurality of segments and thus enable improved handling e.g. on installation. In FIG. 2, the sub-assembly could be assemblable from two semi-circular or a plurality of circular-sector-shaped disks.

The remaining area of the generator 13C is available among other things for accommodating parts of a shim system and/or a cooling system of the generator. In particular, a rod-like area 25 is used to guide feed lines to the conductors of the gradient coils arranged in the disk-shaped area 14A and also to parts of the cooling system arranged therein. By virtue of the enclosing design of the HF shield 19, this is possible without the need for high-frequency bushings.

The invention claimed is:

1. A generator for generating a time-variable magnetic field of a magnetic resonance device having an examination area for accommodating at least one area to be examined of an examination subject, the examination area adapted to be exposed to the generated time-variable magnetic field, the generator comprising:

at least one electrical conductor assigned to the generator for generating the magnetic field using a current flow through the conductor, the at least one electrical conductor comprising a first portion spaced from a second portion whereby a space is defined there between;

a return flow area adapted to allow a field backflow for closing magnetic-field lines the magnetic field, the return flow area formed adjacent to the first portion and the second portion; and at least one sub-assembly having magnetizable material, the sub-assembly arranged within the return flow area for reducing a magnetic energy density within the flow area.

2. The generator according to claim 1, wherein the at least one electrical conductor extends within an area shaped as a disc spaced from an area shaped as a ring.

3. The generator according to claim 1, wherein the at least one electrical conductor is an antenna conductor of a high-frequency antenna unit and the time-variable magnetic field is a high-frequency field for exciting magnetic resonance signals.

4. The generator according to claim 3, wherein the high-frequency antenna unit comprises at least one ferrite pole for bridging a gap between the return flow area and the examination area enabling a closing of the magnetic field lines of the magnetic field not affected by the return flow area.

5. The generator according to claim 3, wherein the antenna conductor is embodied as a high-frequency shield.

6. The generator according to claim 1, wherein the at least one electrical conductor is a gradient conductor of a primary gradient-coil unit and the time-variable magnetic field is a spatially and temporally varying primary gradient field.

7. The generator according to claim 6, wherein the primary gradient-coil unit is enclosed by an antenna conductor of a high-frequency antenna, a portion of the antenna conductor extending into the return flow area.

8. The generator according to claim 6, wherein
the at least one electrical conductor further comprising a secondary gradient conductor of a secondary gradient-coil unit,
the time-variable magnetic field is a spatially and temporally varying secondary gradient field counteracting the primary gradient field outside the examination area, and
the return flow area is arranged on a second side of the secondary gradient conductor, the second side facing toward the examination space.

9. The generator according to claim 8, wherein the sub-assembly is shaped as a flat disk and arranged between the primary and secondary gradient-coil units.

10. The generator according to claim 9, wherein the primary gradient-coil units are shaped as disks sheathed by a high-frequency shield, the high-frequency shield acting as an antenna conductor of a high-frequency antenna within an area adjacent to a primary coil of the primary coil unit.

11. The generator according to claim 1, wherein the return flow area is arranged on a first side of the at least one electrical conductor, the first side facing away from the examination area.

12. The generator according to claim 11, wherein an edge surface of the return flow area is limited by a high-frequency shield.

13. The generator according to claim 1, wherein the return flow area is separated from other parts of the generator by a high-frequency shield.

14. The generator according to claim 1, wherein a first magnetic energy density within the return flow area measured without the sub-assembly installed is greater than a second magnetic energy density measured within the examination space when the generator is in operation.

15. The generator according claim 1, wherein the sub-assembly is shaped as a flat disk arranged within a high frequency antenna resonator, the high frequency antenna resonator comprising at least two planar antenna conductors arranged in parallel.

16. The generator according to claim 15, wherein the antenna conductors are shaped as disks.

17. The generator according to claim 1, the sub-assembly comprising a plurality of segments arranged to form a flat disk.

18. The generator according to claim 1, wherein the magnetizable material is ferrimagnetic and/or ferromagnetic.

19. The generator according to claim 18, wherein the magnetizable material is ferrite or iron powder.

20. The generator according to claim 1, wherein the magnetizable material is encapsulated by an insulating substrate.

21. A magnetic resonance device having a first generator for generating a time-variable magnetic field of a magnetic resonance device having an examination area for accommodating at least one area to be examined of an examination subject, the examination area adapted to be exposed to the generated time-variable magnetic field, the first generator comprising:
    at least one electrical conductor assigned to the first generator for generating the magnetic field using a current flow through the conductor;
    a space formed within the at least one electrical conductor;
    a return flow area adapted to allow a field backflow for closing magnetic-field lines of the magnetic field, the return flow area accessible through the space formed within the at least one electrical conductor; and
    at least one sub-assembly having magnetizable material, the sub-assembly arranged within the return flow area for reducing a magnetic energy density within the return flow area.

22. The magnetic resonance device according to claim 21, further comprising:
    a second generator having the same features as the first generator, and
    a C-shaped permanent magnet having a first and a second pole plate for generating a main magnetic field, each pole plate arranged on an end of the C-shaped permanent magnet and facing the other pole plate, wherein the examination area is arranged between the pole plates and the first and second generators are arranged on the first and second pole plates respectively.

* * * * *